United States Patent [19]
Watari

[11] Patent Number: 5,459,738
[45] Date of Patent: Oct. 17, 1995

[54] APPARATUS AND METHOD FOR DIGITAL CIRCUIT TESTING

[76] Inventor: Hiromichi Watari, 2556 Massachusetts Ave., Cambridge, Mass. 02140

[21] Appl. No.: 187,638

[22] Filed: Jan. 26, 1994

[51] Int. Cl.$^6$ .................................. G01R 31/317
[52] U.S. Cl. ................ 371/27; 324/73.1; 324/765; 364/579; 364/580; 371/22.1; 371/25.1
[58] Field of Search .................. 324/73.1, 765; 364/579, 580; 371/22.1, 25.1, 27

[56] References Cited

U.S. PATENT DOCUMENTS

| | | | |
|---|---|---|---|
| Re. 31,056 | 10/1982 | Chau et al. | 371/22.1 X |
| Re. 31,828 | 2/1985 | Raymond et al. | 371/20 |
| 3,772,595 | 11/1973 | De Wolf et al. | 324/73 R |
| 3,873,818 | 3/1975 | Barnard | 235/153 AC |
| 3,924,109 | 12/1975 | Jhu et al. | 235/153 AC |
| 3,976,940 | 8/1976 | Chau et al. | 324/73 R |
| 4,097,797 | 6/1978 | Finet | 324/73 R |
| 4,348,636 | 9/1982 | Doundoulakis | 324/73 R |
| 4,439,858 | 3/1984 | Petersen | 371/20 |
| 4,450,402 | 5/1984 | Owen, III | 324/72.5 |
| 4,493,019 | 1/1985 | Hughes, Jr. | 371/27 |
| 4,497,056 | 1/1985 | Sugamori | 371/25 |
| 4,523,312 | 6/1985 | Takeuchi | 371/1 |
| 4,572,971 | 2/1986 | Necoechea | 307/52 |
| 4,604,744 | 8/1986 | Littlebury et al. | 371/20 |
| 4,635,259 | 1/1987 | Schinabeck et al. | 371/20 |
| 4,637,020 | 1/1987 | Schinabeck | 371/20 |
| 4,646,299 | 2/1987 | Schinabeck et al. | 371/20 |
| 4,651,088 | 3/1987 | Sawada | 324/73 R |
| 4,656,632 | 4/1987 | Jackson | 371/20 |
| 4,694,242 | 9/1987 | Peterson et al. | 324/73 R |

(List continued on next page.)

OTHER PUBLICATIONS

"The Effect of Backdriving Stress on Digital Ics", by J. K. Skilling, Staff Scientist, GenRad, Inc., Concord, Mass. 01742, USA.
"V-ATE Board Offers Rx for Ailing Motherboards", by Stephen W. Plain, PC Magazine, Mar. 12, 1991.
"Finally, Serious PC Hardward Diagnostics!", Vista Microsystems, Product Literature.
"Pro-Line Model PL 5000 PC Board Diagnostic System", Maxtec International Corp., Product Literature.
"Pro-Line Model PL 5000 Options", Maxtec International Corp., Product Literature.
"Pro-Line Model PL 5010 Programmable IC Tester", Maxtec International Corp., Product Literature.
"Pro-Line Model PL 5030 Autotracer Analog Signature PC Board Analyzer", Maxtec International Corp., Product Literature.
"Iceolator—Combination Functional and In-Circuit Digital Tester", Fairchild, A Schlumberger Company, Product Literature.
"AFD-48, Portable, Self-Programmable, Microprocessor Based, In-Circuit Tester Capable of Fault Diagnosis at the Component Level", Roan Instruments, Products Literature.
"DIT-24 DIT-24XP, Digital IC Test Systems", ABI Electronics, Product Literature.
"PAXR family of PCB diagnostic & repair equipment", PAXR Test Systems, Product Literature.
"SI 635 Diagnostic Test System", Schlumberger Technologies, Product Literature.
"S645 Fault-Finder Combinational Test System", Schlumberger Technologies, Product Literature.
"AFIT 3500 Technical Product Description", Fairchild, A Schlumberger Company, Product Literature.
"AFD 48 Automatic Test Equipment User Documentation", Roan, Product Literature.

*Primary Examiner*—Edward R. Cosimano
*Attorney, Agent, or Firm*—Bromberg & Sunstein

[57] ABSTRACT

An apparatus and method for digital circuit testing in which latches store a single command for each assigned node in a circuit to be tested. Buffers are used to drive the nodes of the circuit being tested in accordance with the drive commands. The outputs from the circuit being tested are selectively applied to at least one comparator. A multiplexor reduces the number of comparators required for accessing the all pertinent nodes of the digital circuit being tested.

20 Claims, 4 Drawing Sheets

U.S. PATENT DOCUMENTS

| | | | |
|---|---|---|---|
| 4,728,883 | 3/1988 | Green | 324/73 R |
| 4,746,855 | 5/1988 | Wrinn | 324/73 R |
| 4,797,627 | 1/1989 | Chism et al. | 330/2 |
| 4,855,670 | 8/1989 | Green | 324/73 R |
| 4,888,548 | 12/1989 | Chism | 324/73 R |
| 4,893,072 | 1/1990 | Matsumoto | 371/223 |
| 4,907,230 | 3/1990 | Heller et al. | 371/22.1 |
| 4,929,888 | 5/1990 | Yoshida | 371/25.1 |
| 4,931,723 | 6/1990 | Jeffrey et al. | 371/22.3 |
| 4,932,246 | 6/1990 | Deutsch et al. | 73/119 A |
| 4,937,826 | 6/1990 | Gheewala et al. | 371/22.1 |
| 4,947,106 | 8/1990 | Chism | 324/73 R |
| 4,972,413 | 11/1990 | Littlebury et al. | 371/22.1 |
| 4,989,209 | 1/1991 | Littlebury et al. | 371/22.1 |
| 4,994,732 | 2/1991 | Jeffrey et al. | 324/73.1 |
| 5,018,145 | 5/1991 | Kikuchi et al. | 371/27 |
| 5,025,205 | 6/1991 | Mydill et al. | 324/73.1 |
| 5,059,893 | 10/1991 | Hiral et al. | 324/74 |
| 5,101,153 | 3/1992 | Morong, III | 324/158 R |
| 5,124,660 | 6/1992 | Cilingiroglu | 324/538 |
| 5,146,159 | 9/1992 | Lau et al. | 324/158 R |
| 5,146,161 | 9/1992 | Kiser | 324/158 R |
| 5,164,665 | 11/1992 | Yamashita et al. | 324/158 R |
| 5,212,443 | 5/1993 | West et al. | 324/158 R |
| 5,225,772 | 7/1993 | Cheung et al. | 324/158 R |
| 5,245,311 | 9/1993 | Honma | 340/146 |
| 5,266,894 | 11/1993 | Takagi et al. | 371/25.1 X |

APPARATUS AND METHOD FOR DIGITAL CIRCUIT TESTING

BACKGROUND OF THE INVENTION

The present invention relates to automated digital test systems. More particularly, the invention relates to a apparatus and method for driving a test sequence through a digital circuit and retrieving the outputs from selected nodes of the circuit.

Automated test equipment for digital circuits, such as integrated circuits mounted on a circuit board, generally offers high speed testing at a significant cost. Referring to FIG. 1, a schematic diagram of a conventional automatic tester 10 for testing a digital circuit is shown. Conventionally, each node of the digital circuit being tested is referred to as a channel. For each channel, electronics are provided including a shift register 12 and a driver 14. The shift registers are capable of acting at high speed and of accepting an entire sequence of drive commands for its respective channel. The drivers 14 are made up of discrete transistors. The transistor drivers 14 are capable of producing a drive signal at any of a variety of logic levels to accommodate the various different types of digital circuits that might be tested by the equipment. The outputs from each node of the digital circuit being tested are provided to a set of comparators 16. Typically, each channel is connected to a pair of comparators 16 for comparison with a high threshold and with a low threshold. The outputs from a comparator are fed serially into a shift register 18. The input shift registers 12 work at high speed to input the drive commands for operating the drivers 14 in quick succession and the output shift registers 18 receive the outputs from the comparators 16 in the same sequential manner. At the completion of the tests, the output shift registers 18 can be unloaded so that the results can be compared to the expected test pattern results. A pass-fail decision can then be made for the tested circuit. The method of this conventional high speed tester begins with a processor loading the input shift registers 12 with a drive command sequence from the memory. The drive command sequence corresponds to a series of tests to be applied to the digital circuit being tested. Each shift register 12 receives the commands for its respective channel. The contents of the shift registers 12 are clocked out to the drivers 14. As the drivers 14 are running the test sequence through the digital circuit, the outputs of the comparators are clocked into the output shift registers. The output shift registers are loaded into the processor for comparison with the expected test result pattern.

U.S. Pat. No. 4,972,413 (Littlebury et al.) suggests an alternate test equipment arrangement in which one set of shift registers is used for both the drive commands and the outputs from the comparators. Littlebury et al. includes, in its testing electronics for each channel, a bidirectional latch for filling and retrieving data from a node memory and interacting with the shift register. Also, a multiplexor is inserted between the shift register and the drivers and another multiplexor between the shift register and the comparators. The multiplexors are used to select between a scan path through which data is transferred into or out of the testing circuit and the associated driver or comparator.

SUMMARY OF THE INVENTION

The present invention is directed to an apparatus and method for testing a digital circuit without the shift registers conventionally used in the prior art. In accordance with an embodiment of the method of the invention, drive commands are written into a latch. These drive commands are used to selectively drive the nodes of the digital circuit. Electrical connections are sequentially made between the nodes of the digital circuit and at least one comparator for comparing the output of a node to at least one threshold. The outputs of the comparator are read. After outputs have been obtained from nodes on the digital circuit, the method may be repeated for the next set of drive commands. A processor compares the outputs obtained in a completed test sequence with the expected results to determine whether the circuit is faulty.

The digital circuit tester of an embodiment of the invention includes a plurality of latches each for storing a single drive command for a node assigned to that latch. A plurality of buffers are used to produce the drive signals onto the nodes of the digital circuit. A buffer may include a plurality of buffers connected in parallel to obtain sufficient current to drive the digital circuit while in a larger circuit. The outputs of the nodes are compared with high and low thresholds to determine the node's logic level.

In accordance with a further embodiment of the invention, multiplexors are connected to the nodes of the digital circuit to be tested such that only a limited number of the outputs are provided to the comparators at one time. The multiplexor is controlled to change the node connections so that all of the pertinent nodes will have a turn in providing their outputs through the comparators.

The digital circuit tester of the present invention can advantageously be mounted on a circuit board for insertion into a personal computer. The elimination of shift registers and reduction in the number of comparators results in a low cost digital circuit tester.

The other objects and advantages of the present invention will become apparent during the following description of the presently preferred embodiments of the invention taken in conjunction with the drawings.

DETAILED DESCRIPTION OF THE PREFERRED EMBODIMENTS

Figure 1:
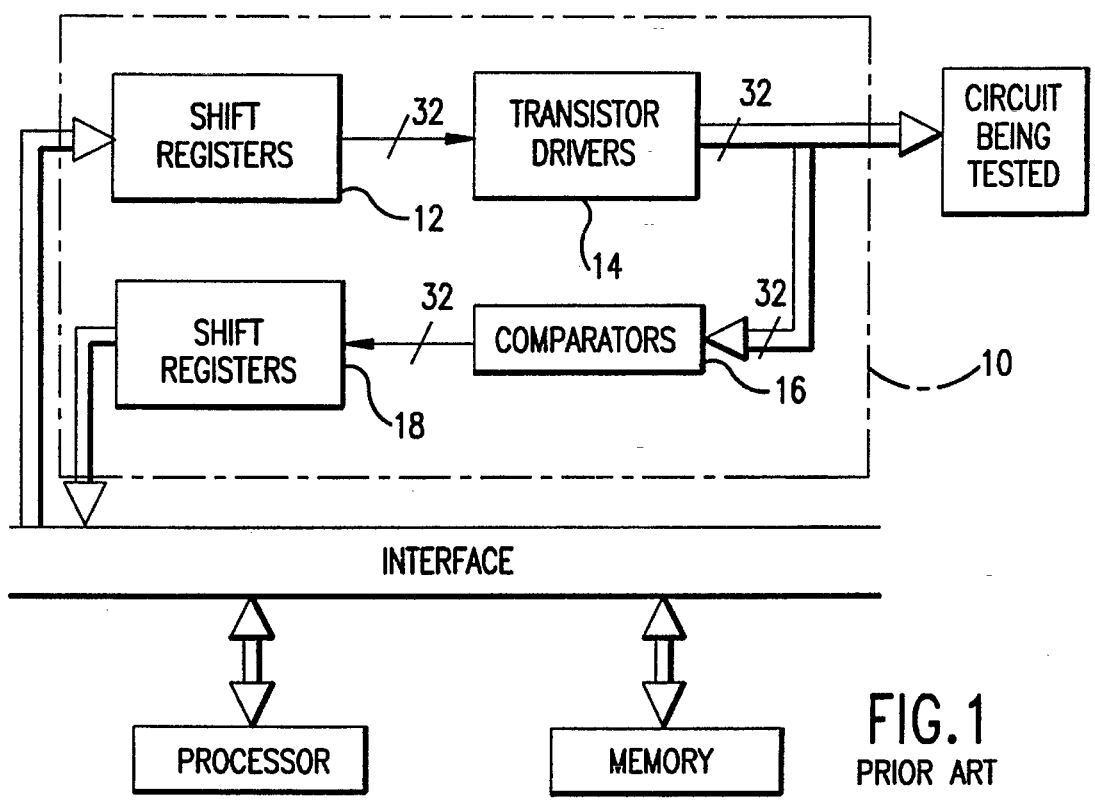
FIG. 1 is a schematic block diagram of automatic test equipment of the prior art.
Figure 2:
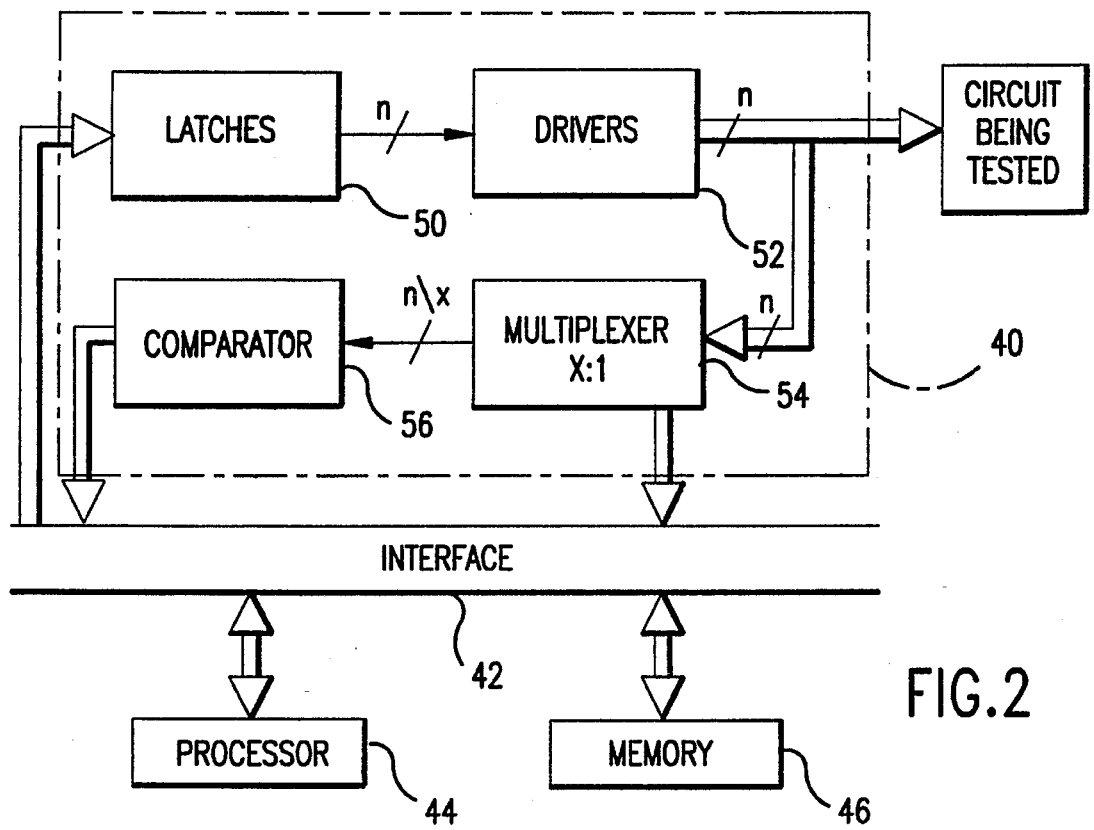
FIG. 2 is a schematic block diagram of a digital circuit tester an embodiment of the invention.

A digital circuit tester 40 of an embodiment of the invention is schematically shown in FIG. 2 connected via an interface 42 to a processor 44. The processor 44 for controlling and operating the digital circuit tester may be within a personal computer, for example. An interface with the processor may be formed through the RS-232 serial port, the parallel printer port or as presently preferred by direct connection of the digital circuit tester into the motherboard of the personal computer. Other conventional means of interfacing with a processor may also be used by a digital circuit tester within the scope of the invention. As is known, the processor 44 is in communication with memory 46. A test for a digital circuit includes a sequence of node drive commands and an expected output pattern. Tests and their accompanying output patterns are known for many of the available integrated circuits on the market. There are many acceptable and conventional methods for making alternative tests for existing circuits as well as for any new integrated circuit introduced on the market.

The digital circuit tester 40 is provided with a set of latches 50 that act as storage for drive commands input by the processor 44. Each latch stores a single drive command for one of the plurality of nodes on a digital circuit to be tested. In performing a test of a digital circuit, it may not be necessary to write commands into all of the latches. When a sequence of tests are being conducted, there may only be one or two changes from one test to the next in the drive commands that are to be applied to the nodes of the digital circuit. The commands that were used in the previous test for most of the nodes may continue to be used for the subsequent test. Thus the processor 44 only needs to write into the latches 50 the drive commands that have changed.

The drive commands in the latches 50 are used to control the operation of a set of drivers 52. Enough drivers are included so that there is at least one for each of the nodes on a circuit to be tested. A digital circuit tester is typically provided with at least 32 drivers so that integrated circuits having 32 or fewer nodes may be tested by the test equipment. On an integrated circuit, each node is accessed through a pin on the chip package. The drivers may be conventional discrete transistors or in accordance with an aspect of an embodiment of the invention, the drivers are of the same logic level type as the circuit to be tested. Thus, for a digital circuit tester designed for use in testing ECL integrated circuits, the drivers are preferably ECL circuits. In the embodiment shown in the present application, CMOS buffers are used as the drivers 52. The logic levels for CMOS and TTL are similar enough so that CMOS buffers may be used for driving either type of circuit. It may be possible, by adjusting the supply voltages to the buffers, for the digital circuit tester to be used on ECL circuits as well. Buffer circuits are not typically used as drivers in an in-circuit digital tester. Buffers are designed to drive inputs, not the outputs of a circuit. When testing in a circuit a node is generally an input of one circuit and an output from a connected circuit. Because a single buffer may be insufficient to provide the current needed to drive a digital circuit that is in a larger circuit, in accordance with the present invention, several buffers are connected together in parallel to produce a single driver. The current from a buffer driver must be sufficient to drive the input to the circuit being tested as well as the output of a circuit connected to the node.

Figure 3:
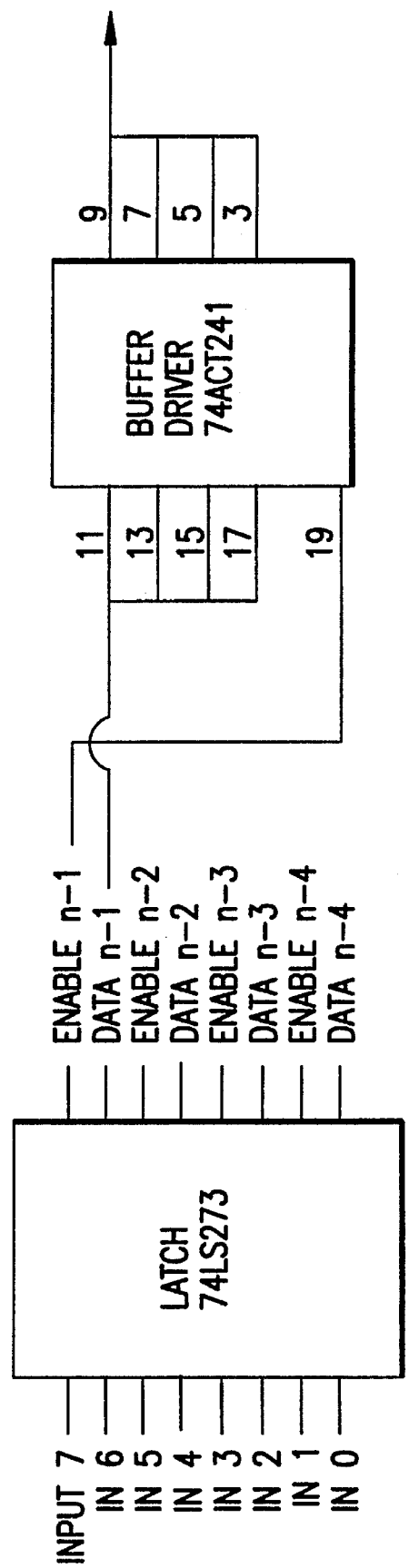
FIG. 3 is a schematic diagram of an input portion of a preferred embodiment of the invention of FIG. 2.

Referring now to FIG. 3, a presently preferred embodiment of the latches and drivers are shown. The circuits selected for use are merely representative of the many circuit possibilities that may be selected for performing the functions of the invention. A 74LS273 eight bit data register may be used as a latch circuit. The latch circuit immediately applies its contents to the driver connected to the latch. Two bits are used for each channel to be tested. It takes two bits to identify the drive command. The enable bit identifies whether or not the node associated with that bit is to be driven at all. If the node is not driven, the buffers are to provide a high impedance. If the node is to be driven, the data bit identifies whether to drive the node high or low. A 74ACT241 buffer circuit is shown for use as the driver. The electrical connections for one of the two drivers provided by the buffer circuit are shown. Pins 11, 13, 15 and 17 of the 74ACT241 are tied together for continuously receiving the data bit from the latch for the assigned channel. Pins 3, 5, 7 and 9 of the 74ACT241 are tied together to provide current for driving the node on the circuit being tested. The enable bit controls whether the buffer driver is turned on or off.

Returning to FIG. 2, the outputs of selected nodes may be read out. In accordance with an embodiment of the invention, a multiplexor 54 is connected between the circuit to be tested and at least one comparator 56. While the invention may be accomplished by providing a comparator or a set of comparators for each channel to be tested, using that many comparators would make the tester substantially more expensive. In order to reduce the number of comparators, the multiplexor 54 is incorporated into the tester. The function of the multiplexor 54 is to select outputs from the circuit being tested and electrically connecting each in turn to the comparator 56. The processor 44 controls the reading of the outputs by sequencing the multiplexor 54 through the different channels in accordance with a test program until all of the pertinent channels have been read through the comparator 56. The advantage of the multiplexor is gained when the number of comparators or sets of comparators is reduced below the number of channels being tested.

A comparator 56 is used for identifying the result generated at a node on the circuit being tested. The comparator may include several comparators, one for each logic level to be tested. Thus, for a circuit tester that handles ECL circuits, there may be a pair of comparators for each multiplexor output. One comparator will have a threshold for an ECL high logic level and the other comparator will compare with a threshold for an ECL low logic level. The comparator outputs are read by the processor 44 and then, after all of the results are in for a particular test of the circuit being tested, they are compared with a predicted pattern of results.

Figure 4:
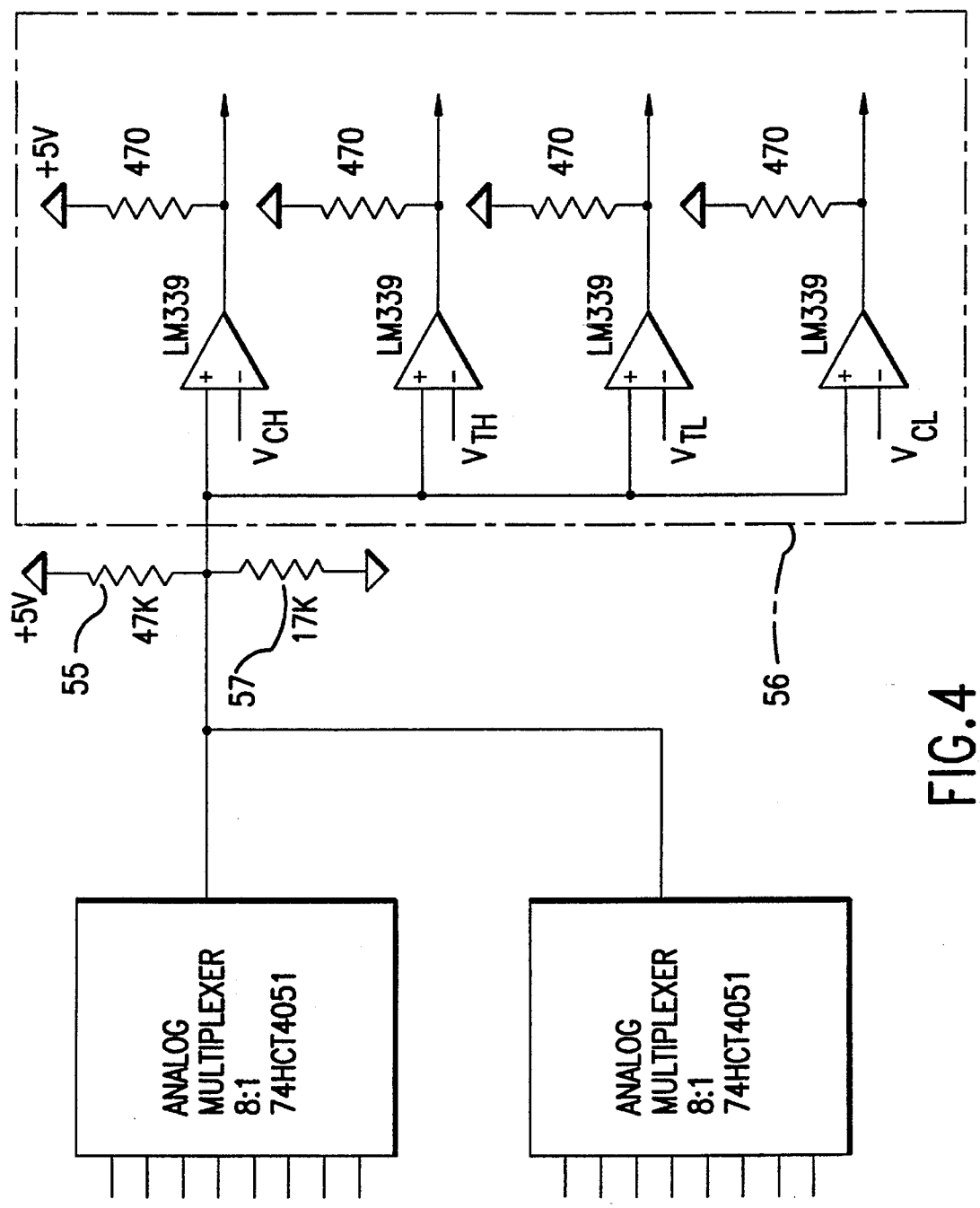
FIG. 4 is a schematic diagram of an output portion of a preferred embodiment of the invention of FIG. 2.

Referring now to FIG. 4, a presently preferred schematic for implementing the multiplexor and comparators is shown. A presently preferred multiplexor may be accomplished with two 74HCT4051 analog multiplexors. This circuit provides a 16:1 multiplexor. A tester that handles 32 channels would be provided with two such 16:1 multiplexors and two sets of comparators. Alternatively, a tester may be provided with four 8:1 multiplexors, eight 4:1 multiplexors or 16 2:1 multiplexors, etc. . .

In order to permit sensing of a high impedance output, a voltage divider is included in a preferred embodiment of the invention. A resistor 55 is connected between a supply voltage and the output of the multiplexor 54. In the illustrated embodiment, the resistor 55 is a 47K ohm resistor and the supply voltage connected thereto is at 5 volts. A resistor 57 is connected between the output of the multiplexor and ground. The resistor 57 is a 17K ohm resistor. The voltage divider formed by resistor 55 and resistor 57 deliver a voltage level to the comparator that is in between the low and high thresholds when the output of the multiplexor is connected to a high impedance. This advantageously enables a high impedance to be identified by the comparator. A high impedance is indicated when the output is below the high threshold and above the low threshold.

A comparator 56 for connection to one multiplexor is made up of several threshold comparators. Each of the threshold comparators is provided for comparing an output signal to one of the predefined logic level voltage thresholds. The presently preferred embodiment illustrated herein is used for testing CMOS or TTL circuits. There are four different threshold comparators provided for comparing an output signal to CMOS high, TTL high, TTL low and CMOS low. The outputs from the threshold comparators can be read by the processor. In accordance with the illustrated embodiment, each comparator issues four logic signals representative of the output from a node in the circuit being tested. Only two of the signals are needed to characterize the result because the circuit being tested is either a CMOS or TTL circuit. When a CMOS circuit is being tested, the TTL results can be ignored by the processor. The processor controls the multiplexor to connect the comparator with each of the nodes whose output is pertinent to the test's output pattern. After all of the pertinent results have been obtained, the processor may proceed to writing new commands into the latches for conducting subsequent tests.

The method of conducting a test of a digital circuit of the present invention shall now be described. The tester of the invention is used to test a digital circuit. In order to handle an integrated circuit package, the tester may be provided with a DIP clip 58 for connecting the pins of the integrated circuit to the tester. Other connectors are available for making connection with the nodes of other types of digital circuits to be tested. The processor 44 writes the drive commands through the interface 42 into the latches 50. Initially, a reset signal may set all of the latches to an initial drive command, preferably high impedance. Thereafter, in subsequent test sequences, the processor 44 may choose to write only those drive commands that have changed from the previous test sequence. As a drive command is written into a latch it is immediately received by the driver and the driver produces a signal accordingly. The drive commands determine whether the drivers produce a high logic level, a low logic level or a high impedance. When the latches have been filled with the appropriate drive commands, the outputs are ready for sensing. The multiplexor 54 is controlled by the processor 44 so as to make electrical connections between the nodes of the circuit being tested and the comparators 56. The results of the comparisons are read by the processor 44 and then the multiplexor 54 is switched to obtain a next set of outputs for connection to the comparators. The test sequence is fully programmable. The drive commands are provided through the processor as is the selection in the multiplexor of which nodes to sense through the comparators and in which order. The processor 44 continues to read the comparator outputs and switch the multiplexor 54 until all pertinent nodes of the circuit being tested have been output through the comparators and read by the processor. The comparison outputs can be compared in the processor 44 with the predicted test result pattern for determining whether the circuit that was tested has passed the test.

Figure 5:
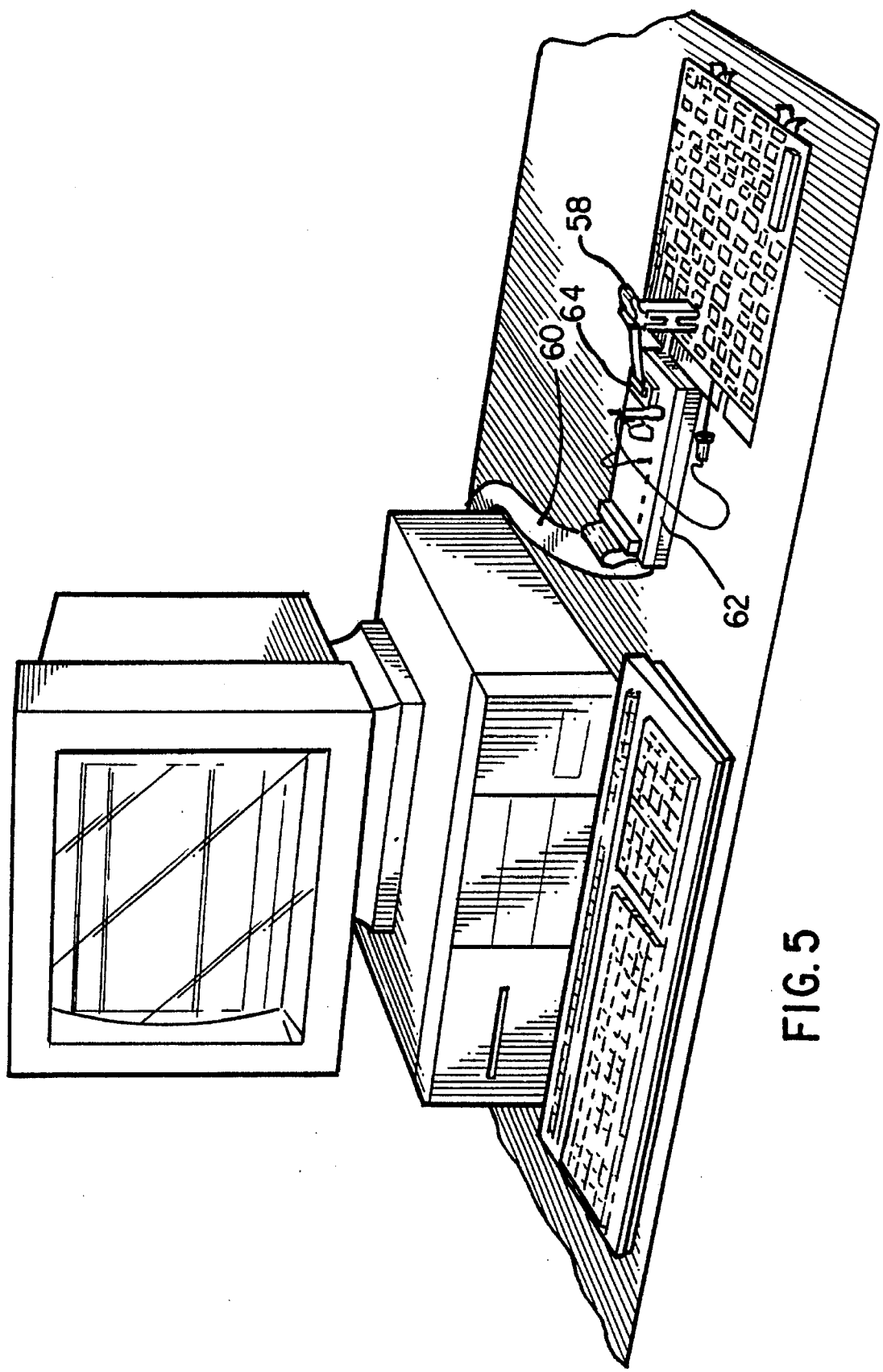
FIG. 5 is an illustration of an embodiment of the invention implemented on a circuit board for insertion into a personal computer.

Referring now to FIG. 5, the tester of one embodiment of the invention is shown mounted on a printed circuit board that is insertable into the motherboard of a personal computer. The tester can then interface directly with the ISA bus of the PC. The connections between the tester and the circuit to be tested are conducted through a flat cable 60. The cable should preferably be kept short to avoid problems associated with transmission delays. The flat cable may be connected to a pod 62. The pod 62 may be provided with an AC termination to prevent reflections of the applied signals. The pod 62 may include a ZIF socket 64. The ZIF socket is used for insertion of a DIP clip 58. The DIP clip 58 is used to connect the tester to a circuit to be tested on a circuit board. The pod may be used to permit a circuit to be tested out-of-circuit by insertion directly into the ZIF socket. Thus, the tester may be used for in-circuit or out-of-circuit testing. The tester of the invention provides service technicians and manufacturers with a low cost alternative for testing digital circuits.

Of course, it should be understood that various changes and modifications to the preferred embodiments will be apparent to those skilled in the art. For example, the multiplexed comparator may be combined with a more conventional input including conventional discrete transistor drivers. On the other hand, the use of buffers and latches to apply a test sequence to a digital circuit may be combined with a conventional comparison and output configuration. Such changes and modifications that can be made without departing from the spirit and scope of the invention are intended to be covered by the following claims.

I claim:

1. A method for in-circuit testing comprising the steps of:
    (a) providing a plurality of latches each connected to an input of one buffer of a plurality of buffers;
    (b) writing commands into selected ones of said plurality of latches;
    (c) said buffers driving selected input nodes within a digital circuit responsive to commands in said plurality of latches, said input nodes serving as inputs to the circuit being tested;
    (d) making an electrical connection between an output node of the circuit being tested and a comparator for comparing the output from the output node to a threshold; and
    (e) reading the output of the comparator.

2. The method of claim 1 further comprising repeating steps d and e for a plurality of different output nodes.

3. The method of claim 1 wherein at least one of the input nodes also serves as an output of a circuit.

4. A digital circuit tester comprising:
    a plurality of latches, each said latch containing a single command for an assigned node on a circuit to be tested;
    a plurality of drivers, each of said drivers connected to one of said latches for immediately receiving the single command contained in said one of said latches for producing a signal, responsive to the single command, at logic levels corresponding to the logic levels of the circuit to be tested and wherein each of said drivers comprises a plurality of buffers connected in parallel so as to produce a drive signal with sufficient current to drive an input of the circuit to be tested and an output of a circuit connected to the circuit to be tested; and
    means for comparing outputs from the nodes of the circuit to be tested with threshold levels.

5. The circuit tester of claim 4 wherein said plurality of drivers comprise CMOS drivers for generating signals at CMOS logic levels.

6. The circuit tester of claim 4 wherein said plurality of drivers comprise ECL drivers for generating signals at ECL logic levels.

7. The circuit tester of claim 4 further comprising means for interfacing with a computer processor so that said computer processor can write commands into said plurality of latches and read outputs of said means for comparing.

8. The circuit tester of claim 7 wherein said means for interfacing comprises an electrical connector for insertion into a motherboard of a computer.

9. A digital circuit tester comprising:
    means for storing commands each of a plurality of assigned nodes on a circuit to be tested;
    a plurality of buffers, each of said buffers connected to receive one of the commands contained in said storing means for driving a signal, responsive to the one command, at logic levels corresponding to the logic levels of the circuit to be tested; and means for comparing outputs from the nodes of the circuit to be tested with threshold levels.

10. The circuit tester of claim 9 wherein each of said buffers comprises a plurality of buffers connected in parallel so as to produce a drive signal with sufficient current to drive an input of the circuit to be tested and an output of a circuit connected to the circuit to be tested.

11. The circuit tester of claim 9 further comprising means for interfacing with a computer processor so that said computer processor can write commands into said storing means and read outputs of said comparing means.

12. The circuit tester of claim 11 wherein said means for interfacing comprises an electrical connector for insertion into a motherboard of a computer.

13. A digital circuit tester comprising:

means for externally driving selected nodes of a digital circuit in accordance with a predefined test;

multiplexor means having a number of inputs for connection to each node of a circuit to be tested and a plurality of outputs, wherein the number of outputs is smaller than the number of inputs; and a plurality of comparators, each comparator connected to one of said plurality of outputs and at least one threshold, each comparator having a comparator output for giving a result of comparing the one of said plurality of outputs connected thereto with the at least one threshold.

14. The circuit tester of claim 13 further comprising a first resistance connected between each of said plurality of outputs of said multiplexor means and a supply voltage and a second resistance connected between each of said plurality of outputs of said multiplexor means and ground, said first and second resistances having resistance values such that when the one of said plurality of outputs is a high impedance a voltage in between a high and low threshold is applied to the comparator connected to said one of said plurality of outputs.

15. The circuit tester of claim 13 wherein said means for externally driving comprises a plurality of drivers each comprised of a plurality of buffers connected in parallel so as to produce a drive signal with sufficient current to drive an input of the circuit to be tested and an output of a circuit connected to the circuit to be tested.

16. The circuit tester of claim 13 further comprising an interface to a processor so that said processor controls which inputs of said multiplexor means are connected to the plurality of outputs and so that said processor can read the outputs out from said comparators.

17. The circuit tester of claim 16 wherein said interface comprises an electrical connector for insertion into a motherboard of a computer.

18. A digital circuit tester comprising:

a plurality of latches, each said latch containing a single command for an assigned node on a circuit to be tested;

a plurality of buffers, each of said buffers connected to at least one of said latches, for driving a signal on the assigned node of a circuit to be tested responsive to the at least one of said latches;

multiplexor means having a number of inputs for connection to each node of a circuit to be tested and at least one output, wherein the number of outputs is smaller than the number of inputs; and a comparator connected to each of said at least one outputs and at least one threshold, each comparator having a comparator output for giving a result of comparing the at least one output connected thereto with the at least one threshold.

19. The digital circuit tester of claim 18 further comprising an interface to a processor so that said processor controls which inputs of said multiplexor means are connected to the at least one output and so that said processor can read the outputs from said comparator.

20. The digital circuit tester of claim 19 wherein said interface comprises an electrical connector for insertion into a motherboard of a computer.

\* \* \* \* \*